(12) United States Patent
Matsuda

(10) Patent No.: US 6,586,718 B2
(45) Date of Patent: Jul. 1, 2003

(54) PHOTODETECTOR AND METHOD FOR FABRICATING THE SAME

(75) Inventor: Kenichi Matsuda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 183 days.

(21) Appl. No.: 09/862,504

(22) Filed: May 23, 2001

(65) Prior Publication Data

US 2002/0000510 A1 Jan. 3, 2002

(30) Foreign Application Priority Data

May 25, 2000 (JP) ........................................ 2000-155485

(51) Int. Cl.⁷ .............................................. H01L 31/00
(52) U.S. Cl. ...................................... 250/214.1; 438/57
(58) Field of Search .............................. 250/214.1, 216, 250/239, 227.11, 214 R, 214 A, 214 LA, 227.18; 257/80–84, 431–435, 447, 451–452, 458–466; 438/22, 24, 27, 40, 43, 45, 63, 65, 67, 78, 79, 57

(56) References Cited

U.S. PATENT DOCUMENTS

| | | | |
|---|---|---|---|
| 5,552,629 A | * | 9/1996 | Watanabe .................. 257/438 |
| 5,689,122 A | | 11/1997 | Chandrasekhar |
| 6,020,620 A | | 2/2000 | Kusakabe |

FOREIGN PATENT DOCUMENTS

| | | |
|---|---|---|
| JP | 05-82829 | 4/1993 |
| JP | 07-86630 | 3/1995 |
| JP | 10-22520 | 1/1998 |

* cited by examiner

*Primary Examiner*—Que T. Le
(74) *Attorney, Agent, or Firm*—Nixon Peabody LLP; Donald R. Studebaker

(57) ABSTRACT

A photodetector includes semiconductor conductive layer, light-absorbing layer and wide bandgap layer, which are stacked in this order on a semi-insulating semiconductor substrate. The conductive layer has been formed on a surface region of the substrate. The photodetector further includes a doped region defined in part of the wide bandgap layer. The conductive layer has etch susceptibility different from that of the substrate.

9 Claims, 9 Drawing Sheets

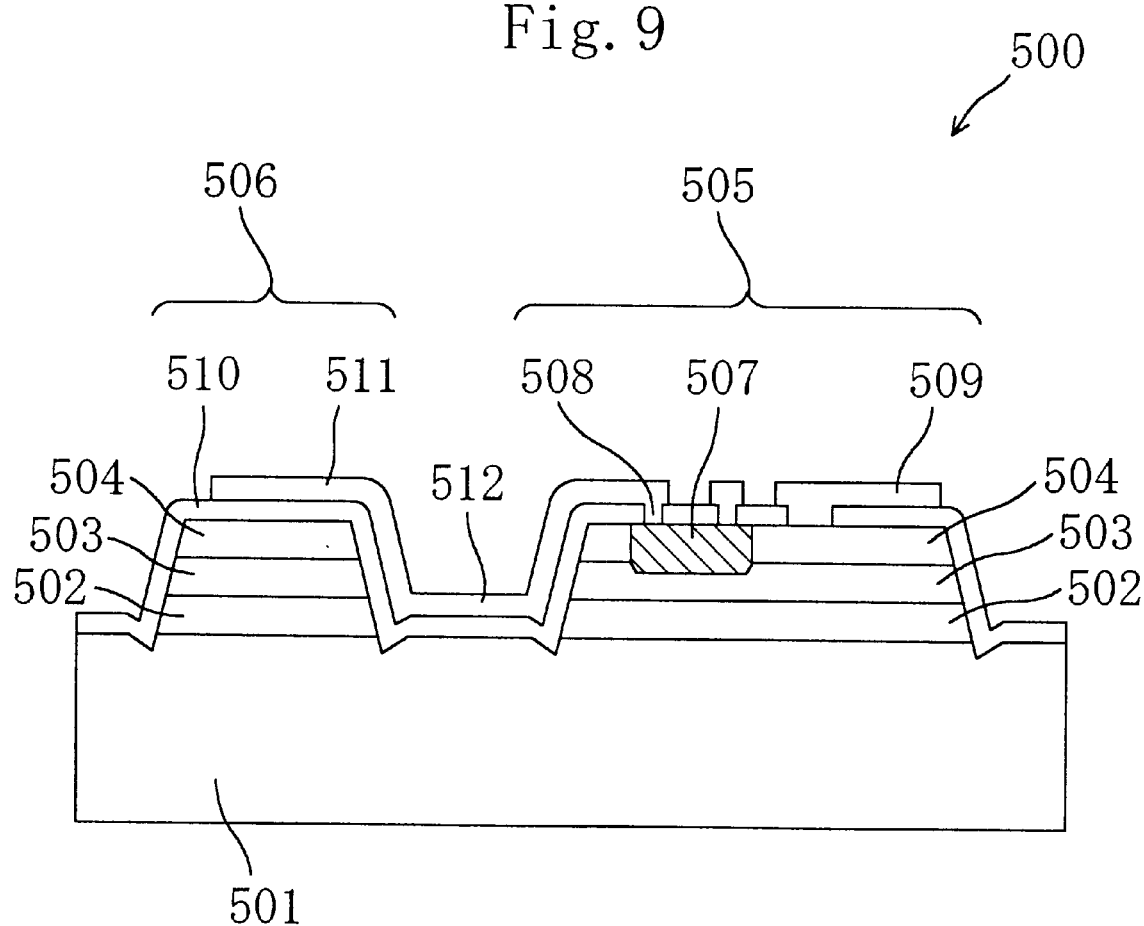

US 6,586,718 B2

PHOTODETECTOR AND METHOD FOR FABRICATING THE SAME

BACKGROUND OF THE INVENTION

The present invention relates to a photodetector and more particularly relates to a high-speed photodetector with the capacitance at its pad portion reduced by forming a mesa-shaped light-absorbing layer on part of a semi-insulating semiconductor substrate and an electrode pad an another part thereof, respectively.

A photodetector for use in fiber optics communication, which exhibits a photosensitivity to some incident radiation with a long wavelength ranging from 1.3 µm to 1.55 µm, may be implemented typically as a pin photodiode made of InGaAs and InP compound semiconductors. A pin photodiode of this type often has its response speed restricted by a CR time constant, which is a product of the capacitance of the photodiode and a load resistance. Accordingly, to increase the response speed of a pin photodiode, the photodiode needs to have a reduced capacitance.

And to reduce the capacitance of a photodiode, not only the junction capacitance but also the capacitance associated with its electrode pad should be reduced as well. In high-speed photodetectors (or photodiodes) of today, in particular, the photodiode section thereof has a much smaller size. Accordingly, a ring electrode (typically with a diameter of about 35 µm) formed on the photodiode section is now smaller in size than an electrode pad (typically with a diameter of about 80 µm) extended from, and disposed near, the ring electrode. For that reason, the capacitance of the electrode pad has a considerable effect on the response speed of the photodiode. In a known structure specially designed to reduce the pad capacitance, a thick insulating film of polyimide is interposed between the electrode pad and a semiconductor layer. However, to further reduce and almost eliminate the pad capacitance, another known structure includes: a mesa-shaped light-absorbing layer on part of a semi-insulating semiconductor substrate; and an electrode pad on another part thereof on which the light-absorbing layer does not exist.

A photodetector with such a structure is disclosed, for example, in Japanese Laid-Open Publication No. 5-82829. FIG. 9 schematically illustrates the structure of the photodetector disclosed in this publication.

The photodetector 500 shown in FIG. 9 includes photodiode mesa 505 and pad mesa 506 that are formed on a semi-insulating InP substrate 501. More specifically, the photodiode mesa 505 includes n$^+$-InP, n$^-$-InGaAs and n-InP layers 502, 503 and 504, which are stacked in this order on part of the substrate 501. On the other hand, the pad mesa 506 also includes the n$^+$-InP, n$^-$-InGaAs and n-InP layers 502, 503 and 504, which are stacked in this order on another part of the substrate 501 where the photodiode mesa 505 does not exist. A pad electrode 511 is formed on the upper surface of the pad mesa 506.

The photodiode mesa 505 further includes a p$^+$-type doped region 507 that has been formed by heavily doping part of the n-InP layer 504 with a p-type dopant so that the dopant reaches the InGaAs layer 503 as a light-absorbing layer. And an insulating film 510 of SiN has been deposited over the substrate 501. A p-side electrode 508 is formed on the insulating film 510 and is electrically connected to part of the doped region 507. An n-side electrode 509 is also formed on the insulating film 510 but is electrically connected to part of the n-InP layer 504 where the doped region 507 does not exist. The p-side electrode 508 on the photodiode mesa 505 is connected to the pad electrode 511 on the pad mesa 506 by way of an interconnect 512 that has been formed on the insulating film 510.

In the photodetector 500 shown in FIG. 9, part of the n$^+$-InP layer 502, which existed between the photodiode and pad mesas 505 and 506 originally, has been removed completely to electrically isolate the photodiode and pad mesas 505 and 506 from each other. The n$^+$-InP layer 502 will be herein called a "semiconductor conductive layer". However, the semiconductor conductive layer 502 and semiconductor substrate 501 are both made of InP, and it is difficult to etch away that part alone as intended. For that reason, in the known photodiode 500, the semiconductor conductive layer 502 is etched rather deep and the surface of the substrate 501 is also etched away partially to remove that part of the semiconductor conductive layer 502 located between the photodiode and pad mesas 505 and 506 completely. As a result, the photodiode and pad mesas 505 and 506 can be isolated electrically, but the respective heights of the mesas 505 and 506 as measured from the surface of the substrate 501 are higher than the originally designed ones.

The higher the photodiode and pad mesas 505 and 506, the harder it is to form the interconnect 512 and bridge these mesas 505 and 506 together as designed. This is because where the mesas 505 and 506 are so high, part of the interconnect 512 located around the corner between the photodiode or pad mesa 505 and 506 and the substrate 501 easily peels off. That is to say, to form the interconnect 512 more reliably, the mesas 505 and 506 should preferably have their heights reduced. In the known photodetector 500, however, the heights of the photodiode and pad mesas 505 and 506 exceed the minimum required ones to completely isolate these mesas 505 and 506 electrically from each other.

In addition, the photodetector 500 shown in FIG. 9 also has a non-negligibly large interconnect capacitance. In the photodetector 500, the pad electrode 511 and part of the interconnect 512 on the substrate 501 create no parasitic capacitance. However, another part of the interconnect 512 on the photodiode mesa 505 does create some interconnect capacitance. Where the photodetector 500 should operate at a high speed with the area of the doped region 507 minimized, this interconnect capacitance is non-negligibly large compared to the junction capacitance thereof. Particularly when the insulating film 510 located between the interconnect 512 and the n-InP layer 504 (which will be herein sometimes called a "window layer") is made of a single SiN layer, the interconnect capacitance increases noticeably. The reason is as follows. Firstly, the SiN layer should be thin enough because cracks would be formed easily otherwise. Also, an SiN film has a higher dielectric constant than that of any other insulating film (e.g., SiO$_2$ film).

SUMMARY OF THE INVENTION

It is therefore an object of the present invention to provide a photodetector that can be mass-produced easily.

Another object of this invention is to provide a high-performance photodetector with an optical filtering function.

Still another object of the invention is to provide a high-speed photodetector with a reduced interconnect capacitance.

An inventive photodetector includes semi-insulating semiconductor substrate, semiconductor conductive layer, light-absorbing layer, wide bandgap layer and doped region. The conductive layer has been formed on a surface region of the substrate and has electrical conductivity. The light-absorbing layer has been formed on the conductive layer and absorbs light that has been incident on the photodetector. The wide bandgap layer has been formed on the light-absorbing layer and has a bandgap wider than that of the light-absorbing layer. And the doped region has been defined in the wide bandgap layer by doping part of the wide bandgap layer with a dopant that reaches the light-absorbing layer. In this photodetector, the conductive layer has etch susceptibility different from that of the substrate.

In the photodetector according to a first aspect of the present invention, the conductive layer has etch susceptibility different from that of the substrate. Accordingly, by using an etchant (e.g., an etchant containing hydrochloric acid) that etches the conductive layer selectively with respect to the substrate, the conductive layer can be etched just as intended. That is to say, the etch process may be stopped as soon as the surface of the substrate is exposed. Thus, the etch process is controllable much more easily and there is no need to remove the uppermost part of the substrate. Accordingly, the mesas do not increase their heights too much. As a result, the interconnect can be formed easily and the photodetector of this type is mass-producible. Also, where a semiconductor multilayer structure (i.e., photodiode mesa), including the semiconductor conductive, light-absorbing and wide bandgap layers, has stepped side faces, a photoresist pattern, determining the shape of the interconnect, can be defined better compared to a mesa with no stepped side faces. Thus, the interconnect can be formed even more satisfactorily.

In one embodiment of the present invention, the substrate, conductive layer, light-absorbing layer and wide bandgap layer may be made of InP, InGaAsP, InGaAs and InP, respectively.

In another embodiment, InGaAsP as a material for the conductive layer may have an absorption edge longer than 0.93 $\mu$m and shorter than 1.55 $\mu$m.

In still another embodiment, the conductive layer may be an n-type semiconductor layer, the dopant may be a p-type dopant and the light-absorbing layer may function as an intrinsic layer of a pin photodiode. And the photodetector may further include: an n-side electrode, which makes an electrical contact with the conductive layer; and a p-side electrode, which makes an electrical contact with the doped region.

In yet another embodiment, a semiconductor multilayer structure, including the semiconductor conductive, light-absorbing and wide bandgap layers, may have been formed on said surface region of the substrate. A second semiconductor conductive layer may have been formed on another surface region of the substrate and may be electrically isolated from the conductive layer included in the multilayer structure. A pad for use to electrically connect the photodetector to an external unit may have been formed on the second conductive layer. And the pad may be electrically connected to the doped region that has been defined in said part of the wide bandgap layer in the multilayer structure.

In this particular embodiment, a ring electrode with an opening at the center thereof has preferably been formed on the doped region. And the ring electrode is preferably connected to the pad by way of an interconnect that has been formed on an insulating film. The insulating film preferably covers the surface of the multilayer structure.

Alternatively or additionally, the semiconductor conductive, light-absorbing and wide bandgap layers, making up the multilayer structure, have preferably been stacked one upon the other to make a level difference exist between each of these layers and an adjacent one of the layers.

Another inventive photodetector includes semi-insulating semiconductor substrate, semiconductor conductive layer, light-absorbing layer, carrier barrier layer, wide bandgap layer and doped region. The conductive layer has been formed on a surface region of the substrate and has electrical conductivity. The light-absorbing layer absorbs light that has been incident on the photodetector. The carrier barrier layer has been formed between the conductive and light-absorbing layers to prevent carriers, created in the conductive layer, from diffusing and entering the light-absorbing layer. The wide bandgap layer has been formed on the light-absorbing layer and has a bandgap wider than that of the light-absorbing layer. And the doped region has been defined in the wide bandgap layer by doping part of the wide bandgap layer with a dopant that reaches the light-absorbing layer. In this photodetector, the conductive layer is made of InGaAsP and transmits part of the incident light with a particular wavelength.

In the photodetector according to a second aspect of the present invention, the barrier layer is formed between the conductive and light-absorbing layers. Accordingly, this photodetector can receive and sense light that has been incident through the backside thereof. In addition, the conductive layer, made of InGaAsP, can selectively transmit light with a particular wavelength out of the incoming light. Accordingly, where the incoming light has two wavelengths of 1.3 $\mu$m and 1.55 $\mu$m, the photodetector may sense part of the incoming light with the latter wavelength of 1.55 $\mu$m. In this manner, a high-performance photodetector with an optical filtering function is realized.

In one embodiment of the present invention, InGaAsP as a material for the conductive layer may have an absorption edge longer than 1.3 $\mu$m and shorter than 1.55 $\mu$m.

More specifically, the absorption edge is preferably longer than 1.35 $\mu$m and shorter than 1.5 $\mu$m.

In an alternative embodiment, InGaAsP as a material for the conductive layer may also have an absorption edge longer than 0.93 $\mu$m and shorter than 1.3 $\mu$m.

More particularly, the absorption edge is preferably longer than 0.93 $\mu$m and shorter than 1.25 $\mu$m.

In another embodiment of the present invention, the substrate and the conductive, barrier, light-absorbing and wide bandgap layers may be made of InP, InGaAsP, InP, InGaAs and InP, respectively.

In still another embodiment, the photodetector may sense light that has been incident on the photodetector through a backside of the substrate.

In yet another embodiment, a semiconductor multilayer structure, including the semiconductor conductive, carrier barrier, light-absorbing and wide bandgap layers, may have been formed on said surface region of the substrate. A second semiconductor conductive layer may have been formed on another surface region of the substrate and may be electrically isolated from the conductive layer included in the multilayer structure. A pad for use to electrically connect the photodetector to an external unit may have been formed on the second conductive layer. And the pad may be electrically connected to the doped region that has been defined in said part of the wide bandgap layer in the multilayer structure.

Still another inventive photodetector includes semi-insulating semiconductor substrate, semiconductor conductive layer, light-absorbing layer, wide bandgap layer, doped region and electrode. The conductive layer has been formed on a surface region of the substrate and has electrical conductivity. The light-absorbing layer has been formed on the conductive layer and absorbs light that has been incident on the photodetector. The wide bandgap layer has been formed on the light-absorbing layer and has a bandgap wider than that of the light-absorbing layer. The doped region has been defined in the wide bandgap layer by doping part of the wide bandgap layer with a dopant that reaches the light-absorbing layer. And the electrode has been formed on the doped region. In this photodetector, a semiconductor multilayer structure, including the semiconductor conductive, light-absorbing and wide bandgap layers, has been formed on said surface region of the substrate. A second semiconductor conductive layer has been formed on another surface region of the substrate and is electrically isolated from the conductive layer included in the multilayer structure. A pad for use to electrically connect the photodetector to an external unit has been formed on the second conductive layer. The multilayer structure is covered with an insulating film. An interconnect has been formed on the insulating film to electrical connect the electrode and the pad together. And the insulating film is a stack of an SiN layer and an $SiO_2$ layer that has been deposited on the SiN layer.

In the photodetector according to a third aspect of the present invention, the insulating film, formed on the surface of the multilayer structure (i.e., photodiode mesa), is a stack of SiN and $SiO_2$ layers. Accordingly, the interconnect capacitance, formed between the interconnect on the insulating film and the multilayer structure, can be reduced compared to a structure in which the insulating film is made of a single SiN layer. As a result, a high-speed photodetector with a reduced interconnect capacitance is realized.

In one embodiment of the present invention, the SiN layer may have a thickness of 20 nm through 100 nm, and the $SiO_2$ layer may have a thickness of 400 nm or more.

In another embodiment of the present invention, the photodetector may further include a carrier barrier layer between the conductive and light-absorbing layers. The barrier layer prevents carriers, created in the conductive layer, from diffusing and entering the light-absorbing layer.

An inventive method for fabricating a photodetector includes the step of a) stacking semiconductor conductive, light-absorbing and wide bandgap layers in this order on a semi-insulating semiconductor substrate by a crystal growth process. The conductive layer has etch susceptibility different from that of the substrate. The light-absorbing layer absorbs incoming light. And the wide bandgap layer has a bandgap wider than that of the light-absorbing layer. The method further includes the steps of b) defining a doped region in part of the wide bandgap layer by doping said part with a dopant that reaches the light-absorbing layer; c) etching and patterning the wide bandgap and light-absorbing layers into respectively predetermined shapes; d) defining an etch mask on the conductive layer so that the wide bandgap and light-absorbing layers in the predetermined shapes are covered with the mask; and e) selectively removing part of the conductive layer using an etchant that etches said part of the conductive layer away with respect to the substrate.

In one embodiment of the present invention, the step c) may include the steps of: i) defining a first etch mask on the wide bandgap layer so that the doped region is covered with the first mask after the step b) has been performed; ii) selectively etching part of the wide bandgap layer away with respect to the light-absorbing layer; iii) defining a second etch mask on the light-absorbing layer so that the wide bandgap layer is covered with the second mask; and iv) selectively etching part of the light-absorbing layer away with respect to the conductive layer.

Specifically, the substrate and the conductive, light-absorbing and wide bandgap layers may be made of InP, InGaAsP, InGaAs and InP, respectively. And the etchant may contain hydrochloric acid.

In an alternative embodiment, the substrate and the conductive, light-absorbing and wide bandgap layers may be made of InP, InGaAsP, InGaAs and InP, respectively. And the steps ii) and iv) may be performed using an etchant containing sulfuric acid.

Another inventive method for fabricating a photodetector includes the step of a) stacking semiconductor conductive, carrier barrier, light-absorbing and wide bandgap layers in this order on a semi-insulating semiconductor substrate by a crystal growth process. The conductive layer has electrical conductivity. The carrier barrier layer prevents carriers, created in the conductive layer, from diffusing and entering upper layers thereof. The light-absorbing layer absorbs incoming light. And the wide bandgap layer has a bandgap wider than that of the light-absorbing layer. The method further includes the steps of: b) defining a doped region in part of the wide bandgap layer by doping said part with a dopant that reaches the light-absorbing layer; c) defining a first etch mask on the wide bandgap layer so that the doped region is covered with the first mask; d) selectively etching part of the wide bandgap layer away with respect to the light-absorbing layer using a first etchant; e) defining a second etch mask on the light-absorbing layer so that the wide bandgap layer is covered with the second mask; f) selectively etching part of the light-absorbing layer away with respect to the barrier layer using a second etchant; g) selectively etching part of the barrier layer away with respect to the conductive layer using a third etchant; h) defining a third etch mask on the conductive layer so that the wide bandgap, light-absorbing and carrier barrier layers are covered with the third mask; and i) selectively etching part of the conductive layer away with respect to the substrate using a fourth etchant.

In one embodiment of the present invention, the substrate and the conductive, barrier, light-absorbing and wide bandgap layers may be made of InP, InGaAsP, InP, InGaAs and InP, respectively. The first and third etchants may contain hydrochloric acid, while the second and fourth etchants may contain sulfuric acid.

Still another inventive method for fabricating a photodetector includes the step of a) stacking semiconductor conductive, light-absorbing and wide bandgap layers in this order on a semi-insulating semiconductor substrate by a crystal growth process. The conductive layer has etch susceptibility different from that of the substrate. The light-absorbing layer absorbs incoming light. And the wide bandgap layer has a bandgap wider than that of the light-absorbing layer. The method further includes the steps of b) defining a doped region in part of the wide bandgap layer by doping said part with a dopant that reaches the light-absorbing layer; c) etching and patterning the wide bandgap and light-absorbing layers into respectively predetermined shapes; d) selectively etching part of the conductive layer away, thereby defining a semiconductor multilayer structure, which includes the wide bandgap and light-absorbing layers in the predetermined shapes and the conductive layer, and leaving a second part of the conductive layer so that the second part serves as a second semiconductor conductive layer spaced apart from the conductive layer included in the multilayer structure; e) depositing SiN and SiO$_2$ layers in this order over the surface of the multilayer structure, exposed parts of the substrate and the second conductive layer, thereby forming an insulating film including the SiN and SiO$_2$ layers; f) removing part of the insulating film, which is located over the doped region in the wide bandgap layer included in the multilayer structure, thereby forming an opening over the doped region; g) forming an electrode on part of the doped region inside the opening; h) forming a pad for use to electrically connect the photodetector to an external unit on either part of the insulating film that has been formed on the exposed part of the substrate or another part of the insulating film that has been formed over the second conductive layer; and i) forming an interconnect on the insulating film to electrically connect the electrode and the pad together.

In one embodiment of the present invention, the steps g), h) and i) may be performed as a single process step.

In this particular embodiment, the single process step preferably includes: depositing a spacer film of SiN on the insulating film; defining a negative photoresist pattern on the spacer film to form the electrode, the pad and the interconnect; etching parts of the spacer film away using the photoresist pattern as a mask; depositing a metal on exposed parts of the insulating film and on the photoresist pattern, thereby forming a metal thin film thereon; and lifting the photoresist pattern off along with excessive parts of the metal on the photoresist pattern, thereby forming the electrode, the pad and the interconnect.

In an inventive photodetector, a semiconductor conductive layer has etch susceptibility different from that of a semiconductor substrate. Accordingly, a semiconductor multi-layer structure, including the conductive layer, does not increase its height too much. As a result, an interconnect can be formed easily and the photodetector of this type is mass-producible.

In another inventive photodetector, a carrier barrier layer is further formed between semiconductor conductive and light-absorbing layers. Accordingly, this photodetector can sense light that has been incident through the backside thereof. In addition, the conductive layer can selectively transmit incoming light with a particular wavelength. As a result, a high-performance photodetector with an optical filtering function (i.e., wavelength selectivity) is realized.

In a third inventive photodetector, an insulating film, deposited on the surface of a semiconductor multilayer structure, is a stack of SiN and SiO$_2$ layers. As a result, a high-speed photodetector with a reduced interconnect capacitance is realized.

BRIEF DESCRIPTION OF THE DRAWINGS

FIG. 9 is a cross-sectional view schematically illustrating a known photodetector.

DESCRIPTION OF THE PREFERRED EMBODIMENTS

Figure 1:
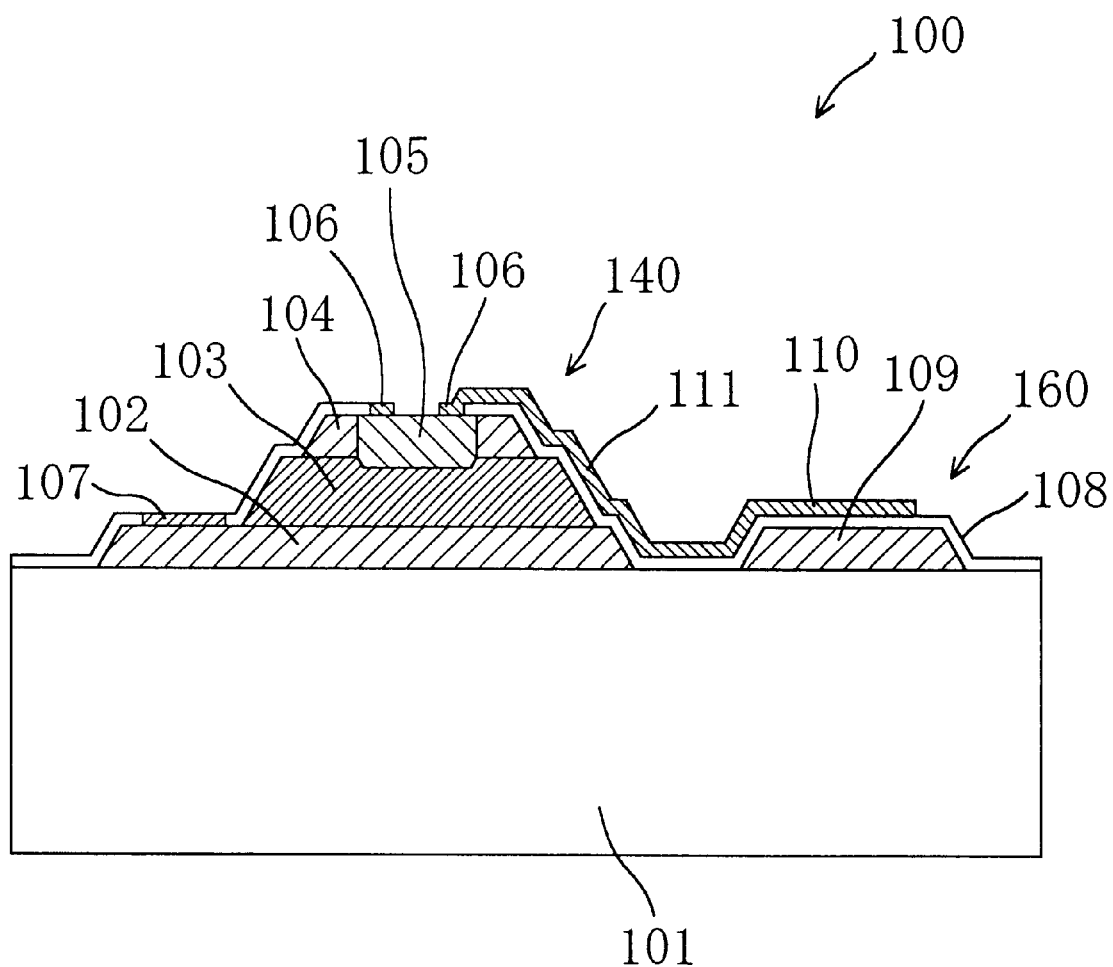
FIG. 1 is a cross-sectional view schematically illustrating a photodetector according to a first embodiment of the present invention.

Hereinafter, preferred embodiments of the present invention will be described with reference to the accompanying drawings, in which each member having substantially the same functions will be identified by the same reference numeral for the sake of simplicity of description. It should be noted that the following embodiments of the present invention are nothing but illustrative ones, and the present invention is in no way limited to these specific embodiments.

Embodiment 1

A first embodiment of the present invention will be described with reference to FIGS. 1 through 3. FIG. 1 schematically illustrates a cross-sectional structure for a photodetector 100 according to the first embodiment.

The photodetector 100 of the first embodiment is a pin photodiode including semiconductor layers of InGaAs and InP compounds. As shown in FIG. 1, the photodetector 100 includes semiconductor conductive layer 102, light-absorbing layer 103 and wide bandgap layer 104, which have been stacked in this order on a semi-insulating semiconductor substrate 101.

The conductive layer 102 with etch susceptibility different from that of the substrate 101 has been formed on a surface region of the substrate 101. In the illustrated embodiment, the substrate 101 is a semi-insulating InP substrate. The conductive layer 102 is made of InGaAsP, which is different from the composition of the InP substrate 101. And the conductive layer 102 serves as an n-layer for the pin photodiode.

The light-absorbing layer 103 on the conductive layer 102 absorbs light that has been incident on the photodetector 100. In the illustrated embodiment, the light-absorbing layer 103 is made of n$^-$-InGaAs and serves as an i-layer for the pin photodiode. The light-absorbing layer 103 exists on part of the conductive layer 102. On another part of the conductive layer 102 where the light-absorbing layer 103 does not exist, an n-side electrode 107 has been formed.

The wide bandgap layer 104 on the light-absorbing layer 103 has a bandgap wider than that of the light-absorbing layer 103. And in part (e.g., center) of the wide bandgap layer 104, a p$^+$-type doped region 105 has been defined by doping that part with a dopant (e.g., Zn) that reaches the light-absorbing layer 103. In the illustrated embodiment, the wide bandgap layer 104 is an n$^-$-InP layer.

The wide bandgap layer 104 has a bandgap wider than that of the light-absorbing layer 103. Accordingly, the wide bandgap layer 104 can transmit light that has such a wavelength as getting the light absorbed into the light-absorbing layer 103. That is to say, the wide bandgap layer 104 can serve as a window layer for the pin photodiode. If the p-type dopant (e.g., Zn in this embodiment) is further diffused to make the wide bandgap layer 104 a main p-type layer, then almost all of the light-absorbing layer 103 can be an i-layer, thus increasing the photosensitivity of the photodetector 100. The function of the wide bandgap layer 104 as a window layer is particularly important where the photodetector 100 is supposed to sense incoming light through the principal surface thereof.

The wide bandgap layer 104 not just functions as a window layer but also reduces a reverse leakage current flowing through the pn junction. The latter function of the wide bandgap layer 104 counts not only where the photodetector 100 senses light incoming through the principal surface thereof but also where the photodetector 100 senses light incident through the backside thereof. It is known that if the pn junction is exposed on the surface of the InGaAs layer (i.e., the light-absorbing layer 103) in an InGaAs/InP pin photodiode, then the leakage current increases. However, where the wide bandgap layer 104 of InP exists on the InGaAs layer 103 as in the illustrated embodiment, the pn junction will be exposed on the surface of the wide bandgap layer 104, not on the surface of the InGaAs layer 103. Accordingly, the leakage current can be reduced compared to a photodetector including no wide bandgap layer 104.

On the $p^+$-type doped region 105 in the wide bandgap layer 104, a p-side electrode 106 has been formed. In the illustrated embodiment, the p-side electrode 106 has a multi-layer structure consisting of Ti, Pt and Au films and is formed as a ring electrode disposed along the outer periphery of the cylindrical doped region 105. A ring electrode with an opening at its center is used as the p-side electrode 106 to prevent the electrode 106 from blocking the incoming light and thereby sense the incoming light as efficiently as possible.

The p-side electrode 106 is electrically connected to a pad electrode 110 for use to electrically connect this photodetector 100 to an external unit (not shown). In the illustrated embodiment, the conductive layer 102, light-absorbing layer 103 and wide bandgap layer 104 with the doped region 105 are all included in a semiconductor multilayer structure (i.e., photodiode mesa) 140. That is to say, the p-side electrode 106 is located on the top of the photodiode mesa 140, while the pad 110, electrically connected to the p-side electrode 106, is located on another surface region of the substrate 101 where the photodiode mesa 140 does not exist.

In the embodiment illustrated in FIG. 1, a second semiconductor conductive layer 109 has been formed on the substrate 101. The second conductive layer 109 is spaced apart from the conductive layer 102 included in the photodiode mesa 140 (which will be called a "first conductive layer" for convenience sake) but is made of the same material as the first conductive layer 102. And the pad 110 is disposed over the second conductive layer 109 with an insulating film 108 interposed therebetween. By spacing the pad 110 apart from the photodiode mesa 140 in this manner, a parasitic capacitance associated with the pad 110 can be reduced.

In the illustrated embodiment, the second conductive layer 109 is used as a pad mesa 160 for mounting the pad 110 thereon. Then, the n-side electrode 107 on the first conductive layer 102 can be substantially leveled with the pad 110 that is electrically connected to the p-side electrode 106. Where the n-side electrode 107 and pad 110 are positioned at substantially the same level, the photodetector 100 can be mounted onto a motherboard with connection members (e.g., bumps) of a size placed on the electrode 107 and pad 110. Thus, the photodetector 100 can be mounted much more easily.

The photodiode mesa 140, pad mesa 160 and substrate 101 are entirely covered with the insulating film 108 of SiN, for example, except the regions where the n- and p-side electrodes 107 and 106 are located. And on this insulating film 108, an interconnect 111 for electrically connecting the p-side electrode 106 to the pad 110 has been formed. In the illustrated embodiment, the p-side electrode 106, pad 110 and interconnect 111 have been formed out of a single multilayer structure consisting of Ti, Pt and Au films.

Also, to define a negative photoresist pattern for the interconnect 111 in a good shape during the fabrication process, the side faces of the photodiode mesa 140 are stepped. That is to say, a level difference exists between each adjacent pair of the layers 102, 103 and 104 included in the photodiode mesa 140. In other words, the upper surface of each underlying layer 102 or 103 included in the photodiode mesa 140 is greater in area than the lower surface of the layer 103 or 104 located on the underlying layer 102 or 103.

The photodetector 100 of the first embodiment may be formed in the following specific shape. However, the present invention is not limited to these specifics but any other appropriate combination may be used instead.

The InP substrate 101 may have a thickness between about 150 $\mu$m and about 200 $\mu$m. The photodiode mesa 140 may have a height of about 5 $\mu$m to about 10 $\mu$m. The first conductive layer 102 may have a thickness of about 1.5 $\mu$m to about 3 $\mu$m and may be formed as a rectangular mesa with an area ranging from (40×80) $\mu$m$^2$ through (100×200) $\mu$m$^2$. Like the first conductive layer 102, the second conductive layer 109 may also have a thickness of about 1.5 $\mu$m to about 3 $\mu$m. The mesa of the second conductive layer 109 may be either in a circular shape with a diameter of about 50 $\mu$m to about 100 $\mu$m or in a rectangular (or square) shape, each side of which is approximately 50 to 100 $\mu$m long.

The light-absorbing layer 103 may have a thickness of about 1.5 $\mu$m to about 3 $\mu$m and the mesa thereof may be in a circular shape with a diameter of about 35 $\mu$m to about 70 $\mu$m. The wide bandgap layer 104 may have a thickness of about 1 $\mu$m to about 2 $\mu$m, and the mesa thereof may be in a circular shape with a diameter of about 30 $\mu$m to about 60 $\mu$m. The doped region 105 in the wide bandgap layer 104 may also be in a circular shape with a diameter of about 25 $\mu$m to about 50 $\mu$m. It should be noted that these members may be formed in the exemplified shapes when viewed from over the photodetector 100 (i.e., in the direction parallel to a normal to the substrate surface).

The carrier densities of these layers 102, 103 and 104 may be as follows. Specifically, the first conductive layer 102 of $n^+$-type may have a relatively high carrier density, while the light-absorbing layer 103 of $n^-$- or i-type may have a relatively low carrier density. In the illustrated embodiment, the wide bandgap layer 104 is an $n^-$-type layer with a relatively low carrier density. However, the carrier density of the wide bandgap layer 104 is not particularly limited.

In the photodetector 100 of this embodiment, the conductive layer 102 has etch susceptibility different from that of the semi-insulating InP substrate 101. For that reason, the conductive layer 102 can be etched selectively. That is to say, the etch process may be stopped as soon as the surface of the InP substrate 101 is exposed. Thus, the etch process is controllable much more easily and there is no need to remove the uppermost part of the InP substrate 101. Accordingly, the photodiode mesa 140 does not increase its height too much. As a result, the interconnect 111 can be formed easily and the photodetector 100 is mass-producible. Also, since the photodiode mesa 140 has stepped side faces, a negative photoresist pattern, determining the shape of the interconnect 111, can be defined better compared to a mesa with no stepped side faces. Thus, the photodetector 100 excels in mass productivity in this respect also.

In the foregoing illustrative embodiment, the present invention is implemented as the photodetector 100 including the stepped photodiode mesa 140. However, the present invention is not limited to such a specific structure, but the photodiode mesa 140 may be formed in any other appropriate shape. Also, in the foregoing embodiment, the p- and n-side electrodes 106 and 107 are formed on the doped region 105 and conductive layer 102, respectively. Nevertheless, to make the pin photodiode operable, the p- and n-side electrodes 106 and 107 only need to be electrically connectable to the light-absorbing layer 103. Accordingly, the locations of these electrodes 106 and 107 are not limited to those illustrated in FIG. 1, either. Thus, it should be easily understandable to those skilled in the art that the photodetector 100 is further modifiable in various ways.

Hereinafter, it will be described with reference to FIGS. 2A through 2D how to fabricate the photodetector 100 of the first embodiment. FIGS. 2A through 2D are cross-sectional views illustrating respective process steps for fabricating the photodetector 100.

Figure 2A:
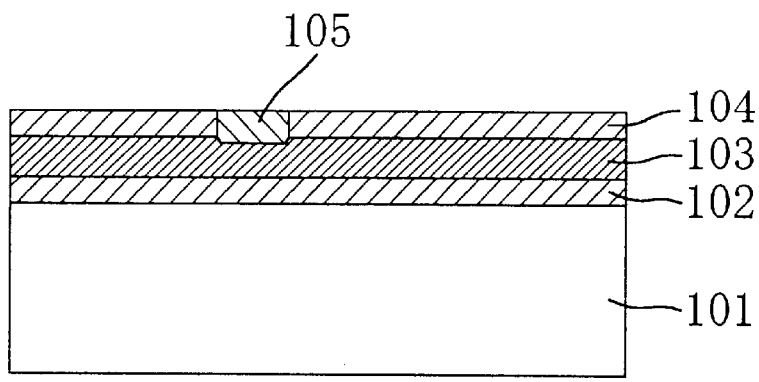
FIGS. 2A through 2D are cross-sectional views illustrating respective process steps for fabricating the photodetector of the first embodiment.

First, as shown in FIG. 2A, semiconductor conductive layer 102 of n-InGaAsP, light-absorbing layer 103 of n⁻-InGaAs, and window layer (i.e., wide bandgap layer) 104 of n⁻-InP are stacked in this order on a semi-insulating semiconductor substrate 101 of InP by a crystal growth process. Next, part of the wide bandgap layer 104 is doped with a dopant (e.g., Zn) that reaches the light-absorbing layer 103, thereby defining a doped region 105.

Specifically, InGaAsP as a material for the conductive layer 102 may be represented by $In_{1-x}Ga_xAs_yP_{1-y}$, where $y=2.12x$. That is to say, the composition $In_{1-x}Ga_xAs_yP_{1-y}$ has a degree of freedom of one. Accordingly, when the mole fraction x or y is defined, a composition InGaAsP with a predetermined absorption edge is determined automatically. In other words, the composition InGaAsP can be represented by the absorption edge thereof.

Figure 3:
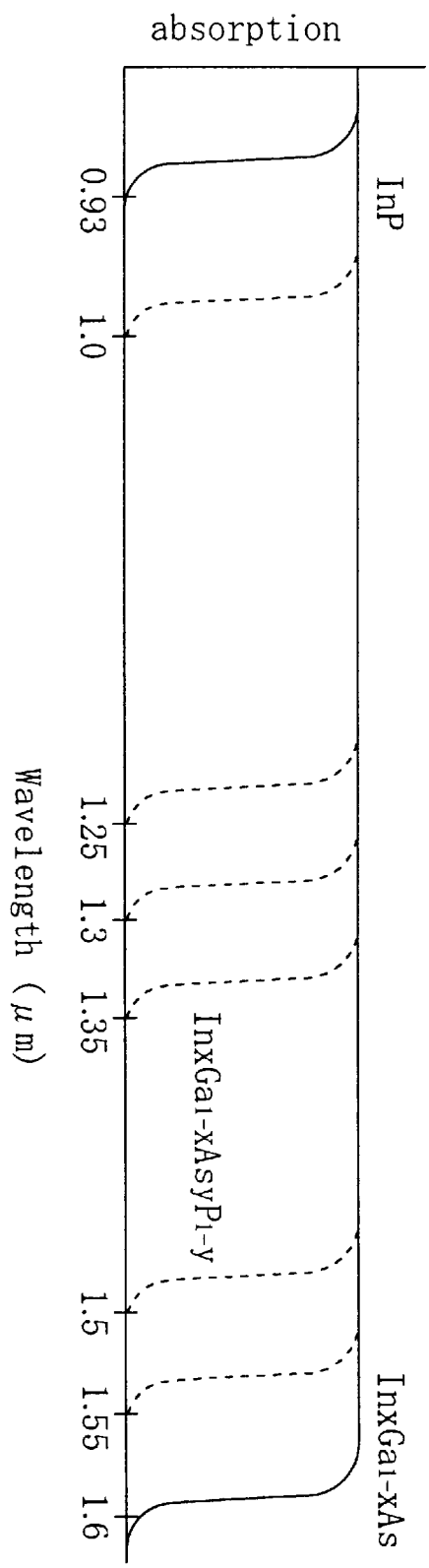
FIG. 3 is a graph illustrating a relationship between the wavelength and the intensity of light absorbed into InGaAsP compounds.

FIG. 3 is a graph illustrating a relationship between the wavelength and the intensity of light absorbed into the InGaAsP compounds. As used herein, the absorption edge of $In_{1-x}Ga_xAs_yP_{1-y}$ (where $0 \leq x \leq 1$ and $0 \leq y \leq 1$) means a maximum wavelength, at and below which light can be absorbed thereto. As can be seen from FIG. 3, InP, not including Ga or As (i.e., where x=0 and y=1 for $In_{1-x}Ga_xAs_yP_{1-y}$), has an absorption edge of 0.93 μm, which is the shortest of all InGaAsP compounds. On the other hand, $In_{1-x}Ga_xAs$, not including P (i.e., where y=1 for $In_{1-x}Ga_xAs_yP_{1-y}$), has an absorption edge slightly longer than 1.6 μm, which is the longest of all InGaAsP compounds. In this manner, an absorption edge for an InGaAsP compound may be arbitrarily selected from the range between these upper and lower limits by setting the mole fraction x and y appropriately.

The following Table 1 shows relationships between the absorption edges λg of $In_{1-x}Ga_xAs_yP_{1-y}$ and the mole fractions x and y along with the bandgaps Eg:

TABLE 1

| Absorption Edge λg (μm) | Bandgap Eg (eV) | Mole Fraction x | Mole Fraction y | Note |
| --- | --- | --- | --- | --- |
| 0.92 | 1.35 | 0.00 | 0.00 | InP |
| 1.00 | 1.24 | 0.07 | 0.16 | |

TABLE 1-continued

| Absorption Edge λg (μm) | Bandgap Eg (eV) | Mole Fraction x | Mole Fraction y | Note |
| --- | --- | --- | --- | --- |
| 1.25 | 0.99 | 0.26 | 0.55 | |
| 1.30 | 0.95 | 0.29 | 0.61 | $In_{0.71}Ga_{0.29}As_{0.61}P_{0.39}$ |
| 1.35 | 0.92 | 0.32 | 0.68 | |
| 1.50 | 0.83 | 0.40 | 0.85 | |
| 1.55 | 0.80 | 0.42 | 0.90 | |
| 1.65 | 0.75 | 0.47 | 1.00 | $In_{0.53}Ga_{0.47}As$ |

As can be seen, by setting the mole fractions x and y arbitrarily, an InGaAsP layer 102 with an absorption edge of 1.0 μm, 1.30 μm, 1.5 μm, etc., can be obtained. To make the etch susceptibility of the n-InGaAsP layer 102 different from that of the InP substrate 101, an n-InGaAsP layer 102 with an absorption edge λg longer than 0.93 μm and shorter than 1.55 μm may be used. To widen the difference in etch susceptibility, an n-InGaAsP layer 102 with an absorption edge λg of 1.0 μm or more should preferably be used.

In the foregoing embodiment, the wide bandgap layer 104 is made of an n⁻-InP layer with λg of 0.92 μm. Accordingly, light with a wavelength of 1.3 or 1.55 μm, which is often used in fiber optics communications, is not absorbed into, but transmitted through, the wide bandgap layer 104. Thus, where the photodetector 100 senses light incoming through the principal surface thereof, the wide bandgap layer 104 can function as a window layer.

Figure 2B:
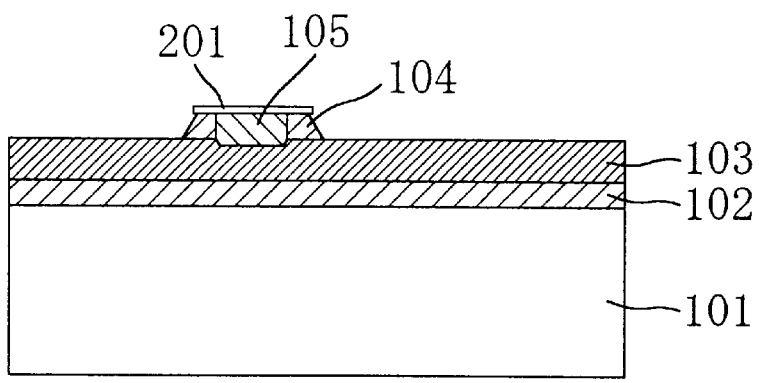

Next, as shown in FIG. 2B, a first etch mask 201, covering the doped region 105, is defined on the wide bandgap layer 104 and then the wide bandgap layer 104 is selectively etched while being masked with the first mask 201. The first mask 201 may be made of SiN, for example. In the illustrated embodiment, when the wide bandgap layer 104 should be etched, a first etchant, realizing an etch selectivity of 10 or more for the wide bandgap layer 104 of InP against the light-absorbing layer 103 of InGaAs, is used. Examples of such etchants include a mixture of hydrochloric acid and phosphoric acid with a volume ratio of 1 to 4. Thereafter, the first mask 201 is removed.

Figure 2C:
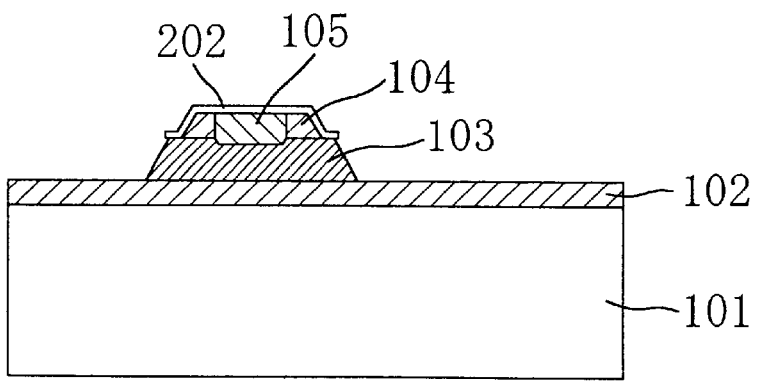

Then, as shown in FIG. 2C, a second etch mask 202, covering the wide bandgap layer 104 including the doped region 105, is defined on a selected area of the light-absorbing layer 103. Subsequently, the light-absorbing layer 103 is selectively etched while being masked with the second mask 202, which may also be made of SiN.

In the illustrated embodiment, when the light-absorbing layer 103 of InGaAs should be etched, a second etchant, realizing an etch selectivity of 10 or more for the light-absorbing layer 103 of InGaAs against the conductive layer 102 of InGaAsP, is used. Examples of such etchants include a mixture of sulfuric acid, hydrogen peroxide water and water with a volume ratio of 1 to 1 to 5. Thereafter, the second mask 202 is removed.

Figure 2D:
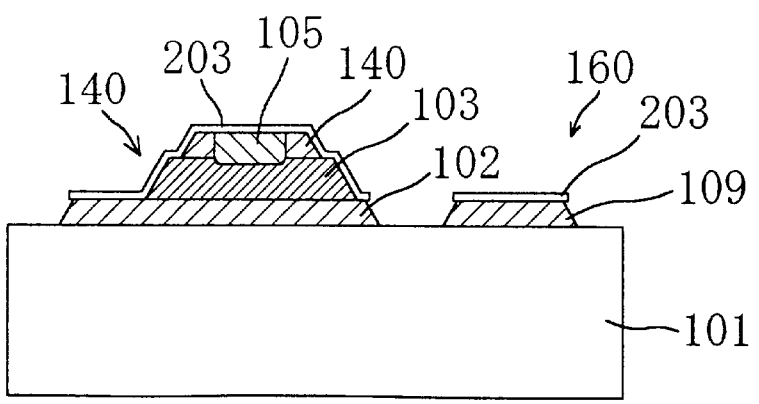

Subsequently, as shown in FIG. 2D, a third etch mask 203 is defined on the conductive layer 102 to cover not only the wide bandgap and light-absorbing layers 104 and 103 but also part of the conductive layer 102 where the mesa-etched light-absorbing layer 103 does not exist. And then the conductive layer 102 is masked with this third mask 203 and partially etched away. The third mask 203 may also be made of SiN.

In the illustrated embodiment, when the conductive layer 102 of InGaAsP should be etched, a third etchant, realizing an etch selectivity of 10 or more for the conductive layer 102 of InGaAsP against the substrate 101 of InP, is used. Examples of such etchants include a mixture of sulfuric acid, hydrogen peroxide water and water with a volume ratio of 5 to 1 to 1.

By performing these etch process steps, a photodiode mesa 140 with stepped side faces and a pad mesa 160 made of the second conductive layer 109 are formed. Thereafter, the third mask 203 is removed. And then an insulating film 108 of SiN, for example, is deposited over the substrate except the area where the doped region 105 should be exposed and the area where an n-side electrode 107 should be formed.

Thereafter, a negative photoresist pattern for p- and n-side electrodes 106 and 107, pad 110 and interconnect 111 is defined. Next, a stack of Ti, Pt and Au films is deposited over the substrate and then the photoresist pattern is lifted off, thereby forming the p- and n-side electrodes 106 and 107, pad 110 and interconnect 111. In this manner, the photodetector 100 shown in FIG. 1 is completed.

In the fabrication process of the first embodiment, the conductive layer 102 of InGaAsP with etch susceptibility different from that of the InP substrate 101 is formed on the substrate 101, and can be etched selectively with respect to the substrate 101. Thus, the etch process is controllable much more easily and there is no need to remove the uppermost part of the substrate 101 for the purpose of isolating the conductive layer 102 electrically. Accordingly, the photodiode mesa 140 can have its height minimized as measured from the surface of the substrate 101.

In the fabrication process of this embodiment, the respective semiconductor layers are etched selectively using a number of etch masks in mutually different shapes. By using these multiple etch masks, the semiconductor layers 104, 103 and 102 on the substrate 101 can be etched sequentially so as to have upwardly decreasing planar areas. That is to say, the respective semiconductor layers can be shaped in such a manner that the photodiode mesa 140 has stepped side faces.

If the negative photoresist pattern is deposited over a non-stepped photodiode mesa 140, then the photoresist pattern will be relatively thick on the lower part of the mesa 140 but relatively thin on the upper part thereof. When such a thin photoresist pattern is defined on the upper part of the mesa 140, then the excessive portions of the stacked metal films, existing on the thin photoresist pattern, cannot be lifted off as intended. As a result, the upper part of the mesa 140 will be entirely covered with those excessive metals. Where the photodiode mesa 140 has stepped side faces as in this embodiment, that thin photoresist pattern, causing the pattern failure, is much less likely formed. That is to say, in this mesa with the stepped cross-sectional shape (or with the gradually and upwardly decreasing planar areas), each semiconductor layer forms a step. Accordingly, compared to a mesa with no stepped side faces (i.e., a mesa that forms only one step by itself), each step of this mesa 140 is much lower. Thus, the interconnect 111 can be formed in a desired shape and the pattern failure can be eliminated. In the fabrication process of the first embodiment, the first through third etch masks are made of SiN. Alternatively, according to the present invention, not just the SiN masks but etch masks made of $SiO_2$ or photoresist may also be used.

Embodiment 2

Figure 4:
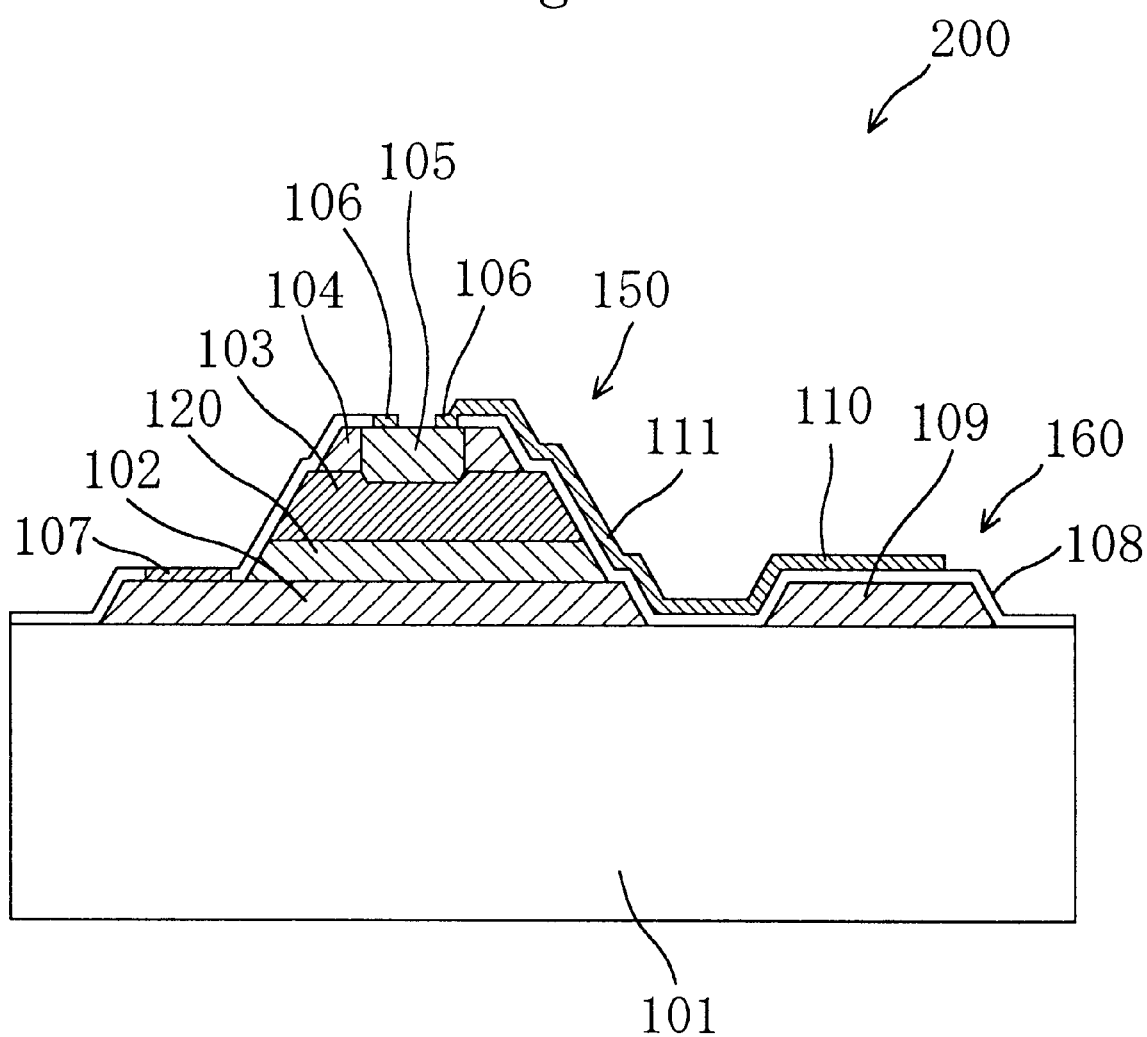
FIG. 4 is a cross-sectional view schematically illustrating a photodetector according to a second embodiment of the present invention.

Hereinafter, a second embodiment of the present invention will be described with reference to FIGS. 4 through 6D. FIG. 4 schematically illustrates a cross-sectional structure for a photodetector 200 according to the second embodiment.

As shown in FIG. 4, the photodetector 200 of the second embodiment is different from the photodetector 100 of the first embodiment in that the photodetector 200 further includes a carrier barrier layer 120 between the first semiconductor conductive layer 102 and light-absorbing layer 103. In the other respects, the photodetectors 200 and 100 have the same structure, and the description thereof will be omitted or simplified herein.

The photodetector 200 shown in FIG. 4 includes photodiode mesa 150 and pad mesa 160 on a semi-insulating InP substrate 101. More specifically, the photodiode mesa 150 includes semiconductor conductive layer 102 of n-InGaAsP, carrier barrier layer (or buffer layer) 120 of $n^-$-InP, light-absorbing layer 103 of $n^-$-InGaAs and wide bandgap layer (or InP window layer) 104 including a $p^+$-type doped region 105. All of these layers 102, 120, 103 and 104 are stacked in this order on the substrate 101 to have upwardly decreasing planar areas. As in the first embodiment, a level difference exists between the first conductive and barrier layers 102 and 120 and between the light-absorbing and wide bandgap layers 103 and 104. A level difference may also exist between the barrier and light-absorbing layers 120 and 103.

The barrier layer 120, interposed between the first conductive and light-absorbing layers 102 and 103, prevents carriers, created in the conductive layer 102, from diffusing and entering the light-absorbing layer 103. Accordingly, the barrier layer 120 can prevent holes, included in electron-hole pairs created in the conductive layer 102 through photoexcitation action, from diffusing and entering the light-absorbing layer 103. The photodetector 200 including this barrier layer 120 can sense incoming light not only through the principal surface thereof but also through the backside thereof. This point will be further detailed below.

Figure 5:
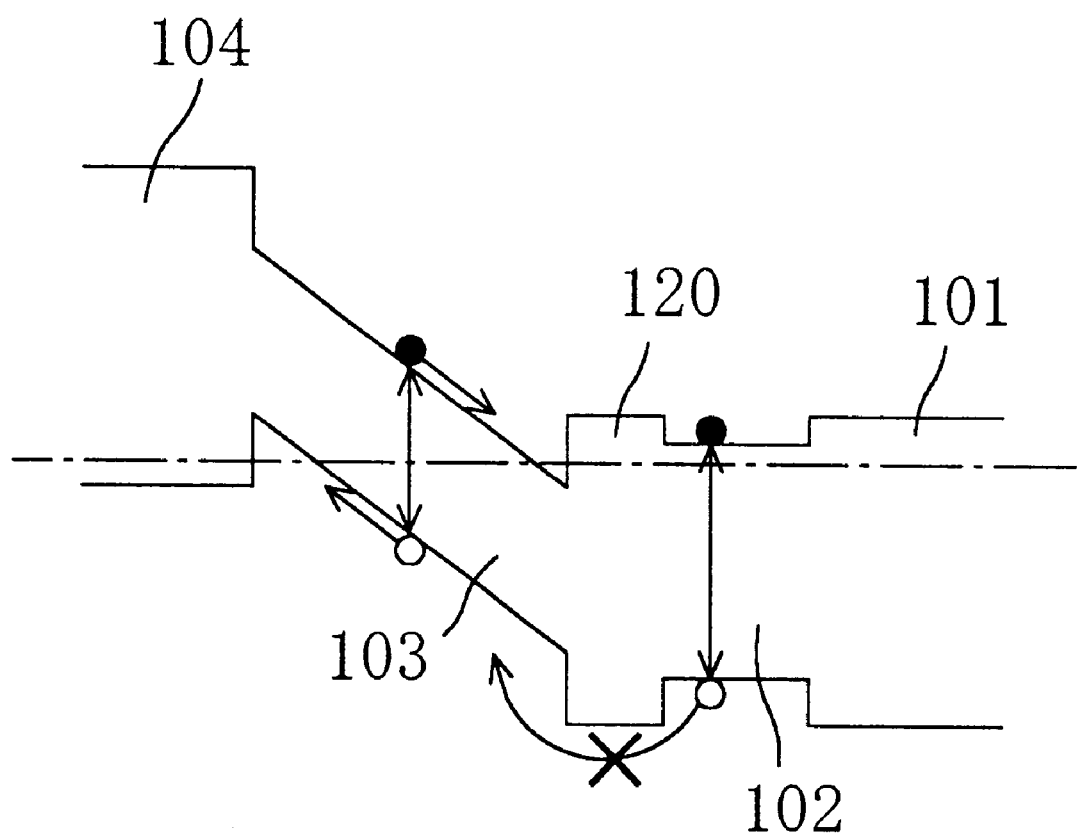
FIG. 5 is a band diagram illustrating the bandgaps of respective layers included in the photodetector of the second embodiment.

FIG. 5 schematically illustrates the bandgaps of the substrate 101 and respective layers 102, 120, 103 and 104 included in the photodetector 200. In FIG. 5, the solid circles indicate electrons while the open circles indicate holes.

Where the photodetector 200 senses incoming light through the backside of the InP substrate 101, the incoming light reaches the conductive layer 102 before entering the light-absorbing layer 103 unlike a photodetector sensing the incoming light through the principal surface thereof. The InP substrate 101 has a relatively wide bandgap, and transmits light with a wavelength of 1.3 or 1.55 $\mu$m for use in fiber optics communications (see FIG. 3 and Table 1). In the conductive layer 102 with a bandgap narrower than that of the substrate 101, photoexcitation might occur responsive to the incident light to produce electron-hole pairs. To prevent holes, included in these electron-hole pairs, from diffusing and reaching the light-absorbing layer 103, the barrier layer 120 of InP, which has a bandgap wider than that of the conductive layer 102, is inserted between the conductive and light-absorbing layers 102 and 103. In this structure, the holes, included in the electron-hole pairs created in the conductive layer 102, cannot reach the light-absorbing layer 103, but remain in the conductive layer 102 and are recombined with the electrons there. Accordingly, no photocurrent will flow.

As shown in FIG. 3 and Table 1, the conductive layer 102 of InGaAsP can have its absorption edge changed by modifying its composition. Accordingly, where the incoming light enters the photodetector 200 through the backside thereof, the conductive layer 102 can function as a filter layer. That is to say, the conductive layer 102 can be provided with not just electrical conductivity but also the filtering function of transmitting part of the incoming light with a particular wavelength.

For example, to selectively sense light with a wavelength of 1.55 μm while allowing light with a wavelength of 1.3 μm to be absorbed into the light-absorbing layer 103, InGaAsP as a material for the conductive layer 102 preferably has an absorption edge longer than 1.3 μm and shorter than 1.55 μm, more preferably longer than 1.35 μm and shorter than 1.5 μm. As described above, the holes, included in the electron-hole pairs created in the conductive layer 102 responsive to the incident light with a wavelength of 1.3 μm, cannot reach the light-absorbing layer 103 due to the existence of the barrier layer 120, and are recombined with the electrons in the conductive layer 102. As a result, no photocurrent will be created in response to the light with the wavelength of 1.3 μm. On the other hand, the light with the wavelength of 1.55 μm is transmitted through the conductive layer 102 and then absorbed into the light-absorbing layer 103 so as to create a photocurrent. Accordingly, the photodetector 200 can exhibit a photosensitivity only to the light with the wavelength of 1.55 μm. In this manner, the photodetector 200 can be given wavelength selectivity.

If the light with the wavelength of 1.3 μm, as well as the light with the wavelength of 1.55 μm, should be sensed, then InGaAsP as a material for the conductive layer 102 should have an absorption edge shorter than 1.3 μm. Specifically, the absorption edge is preferably longer than 0.93 μm and shorter than 1.3 μm, more preferably longer than 0.93 μm and shorter than 1.25 μm. In that case, the light with the wavelength of 1.3 μm and the light with the wavelength of 1.55 μm are transmitted through the conductive layer 102 and then absorbed into the light-absorbing layer 103.

In the second embodiment, the conductive layer 102 has a filtering function. Accordingly, there is no need to separately provide a filter layer to give wavelength selectivity to the photodetector. For that reason, a photodetector with wavelength selectivity is implementable using a simplified structure, thus cutting down the fabrication cost. In addition, the InP substrate 101 and conductive layer 102 have mutually different etch susceptibilities, so the photodetector 200 is mass-producible as well because of the same reasons described for the first embodiment.

In the foregoing embodiment, the barrier layer 120 is made of InP. Alternatively, the barrier layer 120 may be made of any other compound so long as the layer 120 can prevent the carriers, created in the conductive layer 102, from reaching the light-absorbing layer 103. Also, the pad mesa 160 does not have to be the second conductive layer 109, but may be any other type of layer (e.g., insulating layer). However, the pad mesa 106 is preferably formed out of the second conductive layer 109, which is made of the same material as the first conductive layer 102, because it is easier to fabricate the photodetector 200.

The photodetector 200 of the second embodiment may be formed in the following specific shape. However, the present invention is not limited to these specifics but any other appropriate combination may be used instead.

The InP substrate 101 may have a thickness of about 150 μm. The photodiode mesa 140 may have a height of about 5 μm to about 10 μm. The first conductive layer 102 may have a thickness of about 1.5 μm to about 3 μm and may be formed as a rectangular mesa with an area ranging from (40×80) μm² through (100×200) μm². Like the first conductive layer 102, the second conductive layer 109 may also have a thickness of about 1.5 μm to about 3 μm. The mesa of the second conductive layer 109 may be either in a circular shape with a diameter of about 50 μm to about 100 μm or in a rectangular (or square) shape, each side of which is approximately 50 to 100 μm long.

The barrier layer 120 may have a thickness of about 1 μm to about 2 μm, and the mesa thereof may be formed in a similar shape to that of the light-absorbing layer 103. The light-absorbing layer 103 may have a thickness of about 1.5 μm to about 3 μm, and the mesa thereof may be in a circular shape with a diameter of about 35 μm to about 70 μm. The wide bandgap layer 104 may have a thickness of about 1 μm to about 2 μm, and the mesa thereof may be in a circular shape with a diameter of about 30 μm to about 60 μm. The doped region 105 in the wide bandgap layer 104 may also be in a circular shape with a diameter of about 25 μm to about 50 μm. It should be noted that these members may be formed in the exemplified shapes when viewed from over the photodetector 200 (i.e., in the direction parallel to a normal to the substrate surface).

The carrier densities of these layers 102, 120, 103 and 104 may be as follows. Specifically, the first conductive layer 102 of $n^+$-type may have a relatively high carrier density, while the light-absorbing layer 103 of $n^-$- or i-type may have a relatively low carrier density. In the illustrated embodiment, the wide bandgap and carrier barrier layers 104 and 120 are $n^-$-type layers with a relatively low carrier density. However, the carrier densities of these layers 104 and 120 are not particularly limited.

Hereinafter, it will be described with reference to FIGS. 6A through 6D how to fabricate the photodetector 200 of the second embodiment. FIGS. 6A through 6D are cross-sectional views illustrating respective process steps for fabricating the photodetector 200.

Figure 6A:
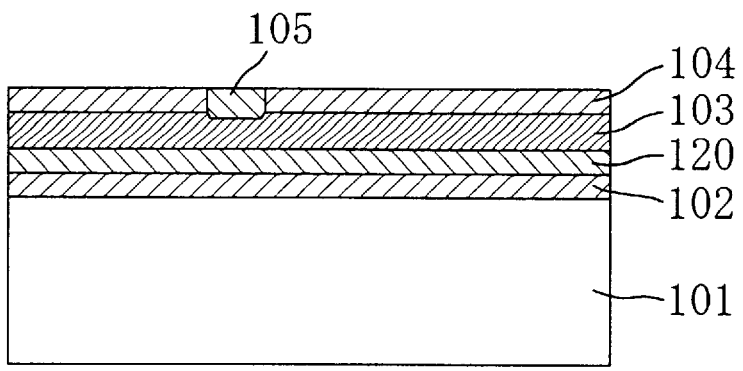
FIGS. 6A through 6D are cross-sectional views illustrating respective process steps for fabricating the photodetector of the second embodiment.

First, as shown in FIG. 6A, semiconductor conductive layer 102 of n-InGaAsP, carrier barrier layer 120 of $n^-$-InP, light-absorbing layer 103 of $n^-$-InGaAs, and wide bandgap layer 104 of $n^-$-InP are stacked in this order on a semi-insulating semiconductor substrate 101 of InP by a crystal growth process. Next, part of the wide bandgap layer 104 is doped with a dopant (e.g., Zn) that reaches the light-absorbing layer 103, thereby defining a doped region 105. As described above, in fabricating a photodetector 200 that senses the light with a wavelength of 1.55 μm selectively through the backside thereof, InGaAsP as a material for the conductive layer 102 preferably has an absorption edge longer than 1.3 μm and shorter than 1.55 μm, more preferably longer than 1.35 μm and shorter than 1.5 μm.

Figure 6B:
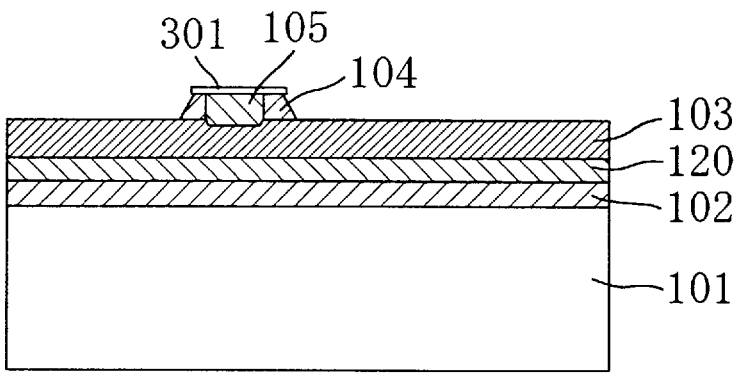

Next, as shown in FIG. 6B, a first etch mask 301, covering the doped region 105, is defined on the wide bandgap layer 104 and then the wide bandgap layer 104 is selectively etched while being masked with the first mask 301. The first etch mask 301 may be made of SiN, for example. In the illustrated embodiment, when the wide bandgap layer 104 should be etched, a first etchant, realizing an etch selectivity of 10 or more for the wide bandgap layer 104 of InP against the light-absorbing layer 103 of InGaAs, is used. Examples of such etchants include a mixture of hydrochloric acid and phosphoric acid with a volume ratio of 1 to 4. Thereafter, the first mask 301 is removed.

Figure 6C:
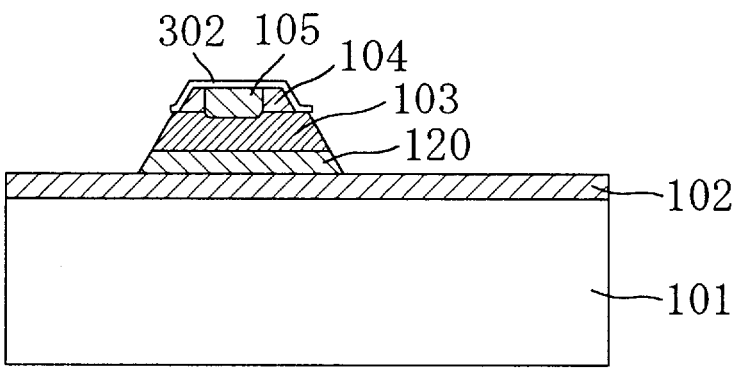

Then, as shown in FIG. 6C, a second etch mask 302, covering the wide bandgap layer 104 including the doped region 105, is defined on a selected area of the light-absorbing layer 103. Subsequently, the light-absorbing and barrier layers 103 and 120 are etched selectively while being masked with the second mask 302, which may also be made of SiN.

In the illustrated embodiment, when the light-absorbing layer 103 of InGaAs should be etched, a second etchant, realizing an etch selectivity of 10 or more for the light-absorbing layer 103 of InGaAs against the barrier layer 120 of InP, is used. Examples of such etchants include a mixture of sulfuric acid, hydrogen peroxide water and water with a volume ratio of 1 to 1 to 5. On the other hand, when the barrier layer 120 of InP should be etched, a third etchant, realizing an etch selectivity of 10 or more for the barrier layer 120 of InP against the conductive layer 102 of InGaAsP, is used. Examples of such etchants include a mixture of hydrochloric acid and phosphoric acid with a volume ratio of 1 to 4. Thereafter, the second mask 302 is removed.

Figure 6D:
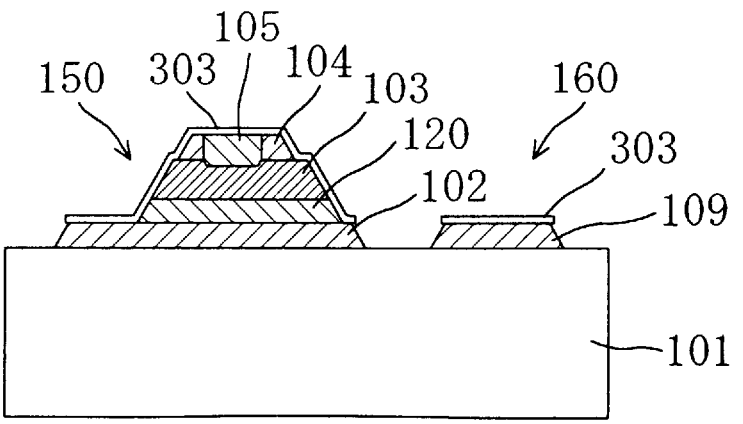

Subsequently, as shown in FIG. 6D, a third etch mask 303 is defined on the conductive layer 102 to cover not only the wide bandgap, light-absorbing and carrier barrier layers 104, 103 and 120 but also part of the conductive layer 102 where the mesa-etched light-absorbing layer 103 does not exist. And then the conductive layer 102 is masked with this third mask 303 and partially etched away. The third mask 303 may also be made of SiN.

In the illustrated embodiment, when the conductive layer 102 of InGaAsP should be etched, a fourth etchant, realizing an etch selectivity of 10 or more for the conductive layer 102 of InGaAsP against the substrate 101 of InP, is used. Examples of such etchants include a mixture of sulfuric acid, hydrogen peroxide water and water with a volume ratio of 1 to 1 to 5.

By performing these etch process steps, a photodiode mesa 150 with stepped side faces and a pad mesa 160 made of the second conductive layer 109 are formed. Thereafter, the third mask 303 is removed. And then an insulating film 108 of SiN, for example, is deposited over the substrate except the area where the doped region 105 should be exposed and the area where an n-side electrode 107 will be formed.

Thereafter, a negative photoresist pattern for p- and n-side electrodes 106 and 107, pad 110 and interconnect 111 is defined. Next, a stack of Ti, Pt and Au films is deposited over the substrate and then the photoresist pattern is lifted off, thereby forming the p- and n-side electrodes 106 and 107, pad 110 and interconnect 111. In this manner, the photodetector 200 shown in FIG. 4 is completed.

In the fabrication process of the second embodiment, the conductive layer 102 of InGaAsP with etch susceptibility different from that of the InP substrate 101 is formed on the substrate 101, and can be etched selectively with respect to the substrate 101. Thus, the etch process is controllable much more easily. As a result, the photodiode mesa 150 can have its height minimized.

In addition, the respective semiconductor layers are etched selectively using the three etch masks in mutually different shapes. By using these multiple etch masks, the respective semiconductor layers 102, 120, 103 and 104 can be stacked one upon the other so that the photodiode mesa 150 has stepped side faces. As a result, the interconnect 111 can be formed in a desired shape and the disconnection thereof is avoidable. Furthermore, in the fabrication process of the second embodiment, the light-absorbing and barrier layers 103 and 120 are both masked with the second mask 302 and etched using the second and third etchants, respectively. Accordingly, it takes a reduced number of process steps to define the etch masks.

Embodiment 3

Figure 7:
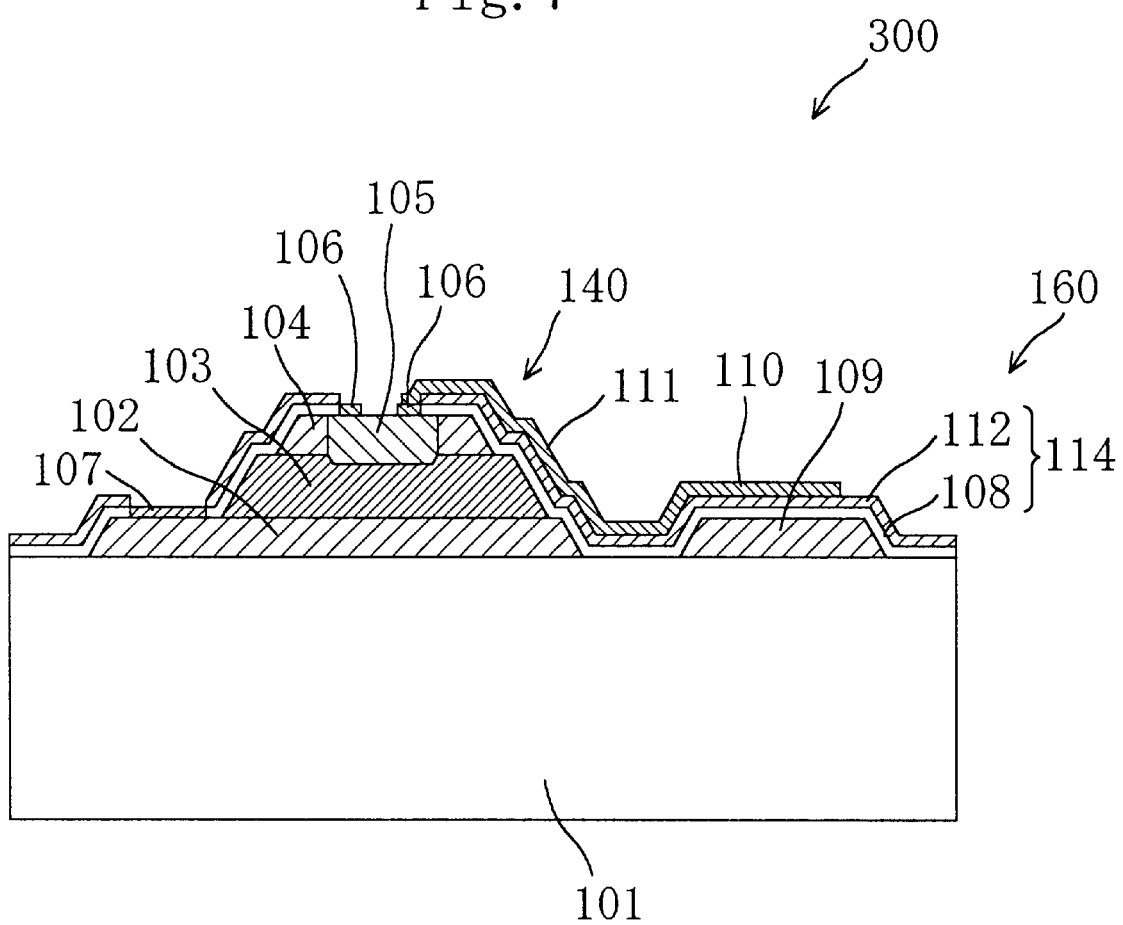
FIG. 7 is a cross-sectional view schematically illustrating a photodetector according to a third embodiment of the present invention.

Hereinafter, a third embodiment of the present invention will be described with reference to FIGS. 7 through 8D. FIG. 7 schematically illustrates a cross-sectional structure for a photodetector 300 according to the third embodiment.

As shown in FIG. 7, the photodetector 300 of the third embodiment is different from the photodetector 100 of the first embodiment in that the insulating film 114 as an undercoat for the interconnect 111 is a stack of SiN and $SiO_2$ layers in the photodetector 300. In the other respects, the photodetector 300 has the same structure as the photodetector 100, and the description thereof will be omitted or simplified herein.

The photodetector 300 shown in FIG. 7 includes photodiode mesa 140 and pad mesa 160 on a semi-insulating InP substrate 101. More specifically, the photodiode mesa 140 includes semiconductor conductive layer 102 of n-InGaAsP, light-absorbing layer 103 of $n^-$-InGaAs and wide bandgap layer (or InP window layer) 104 including a $p^+$-type doped region 105. All of these layers are stacked in this order on the substrate 101 to have upwardly decreasing planar areas. As in the first embodiment, a level difference exists between the conductive and light-absorbing layers 102 and 103 and between the light-absorbing and wide bandgap layers 103 and 104. It should be noted that a carrier barrier layer 120 may be additionally formed between the conductive and light-absorbing layers 102 and 103 as in the second embodiment. Also, the pad mesa 160 does not have to be the second conductive layer 109, but may be any other type of layer (e.g., insulating layer).

In the photodetector 300, an insulating film 114, consisting of passivation film 108 of SiN and interlevel dielectric film 112 of $SiO_2$, is deposited over the substrate except the area where the doped region 105 should be exposed and the area where an n-side electrode 107 is formed. More specifically, the SiN passivation film 108 (which will be simply referred to as an "SiN layer") has been deposited to cover the surfaces of the photodiode and pad mesas 140 and 160 and the exposed surface of the substrate 101. And the $SiO_2$ interlevel dielectric film 112 (which will be simply referred to as an "$SiO_2$ layer") has been deposited on the SiN layer 108. In the illustrated embodiment, the SiN layer 108 may have a thickness of about 30 nm and the $SiO_2$ layer 112 may have a thickness of about 500 nm.

In the photodetector 300 of the third embodiment, the insulating film 114, covering the surface of the photodiode mesa 140, has a multilayer structure and is thicker than the single SiN layer 108 for the first or second embodiment. Accordingly, the interconnect capacitance can be reduced. Hereinafter, it will be described why the insulating film 114 is formed as a stack of the SiN and $SiO_2$ layers 108 and 112.

Generally speaking, the thickness of an SiN layer should not exceed a certain limit because cracks would be formed easily in a thick SiN layer. In addition, an SiN layer has a dielectric constant higher than that of an $SiO_2$ layer. However, it is also known that where a passivation film for an InP photodetector is made of $SiO_2$, a leakage current, flowing through the photodetector, increases compared to a structure in which the photodetector includes a passivation film of SiN. Thus, the present inventor believed that if the insulating film is formed as a stack of a thick $SiO_2$ layer for reducing the capacitance on a thin SiN layer for passivation purposes, then a photodetector including that insulating film should have its leakage current and interconnect capacitance both reduced. And as a result of experiments I carried out, I succeeded in making a photodetector 300 with an interconnect capacitance that had been reduced to about half of the junction capacitance thereof. Specifically, the photodetector 300 shown in FIG. 7 had a junction capacitance of 0.1 pF and an interconnect capacitance of 0.05 pF.

The SiN layer 108 preferably has a thickness of 20 nm through 100 nm. This is because where the SiN layer 108 has a thickness of 20 nm or more, good passivation effects are attainable. Also, if the thickness of the SiN layer 108 is 100 nm or less, no cracks will be made in the SiN layer 108. On the other hand, where a photodetector, including a doped region 105 with a diameter of about 35 µm, should have its interconnect capacitance halved compared to the junction capacitance thereof, the SiO$_2$ layer 112 preferably has a thickness of 400 nm or more. The SiO$_2$ layer 112 has no maximum allowable thickness, but may be of any thickness appropriate for the photodetector 300.

Hereinafter, it will be described with reference to FIGS. 8A through 8D how to fabricate the photodetector 300 of the third embodiment. FIGS. 8A through 8D are cross-sectional views illustrating respective process steps for fabricating the photodetector 300 of the third embodiment.

Figure 8A:
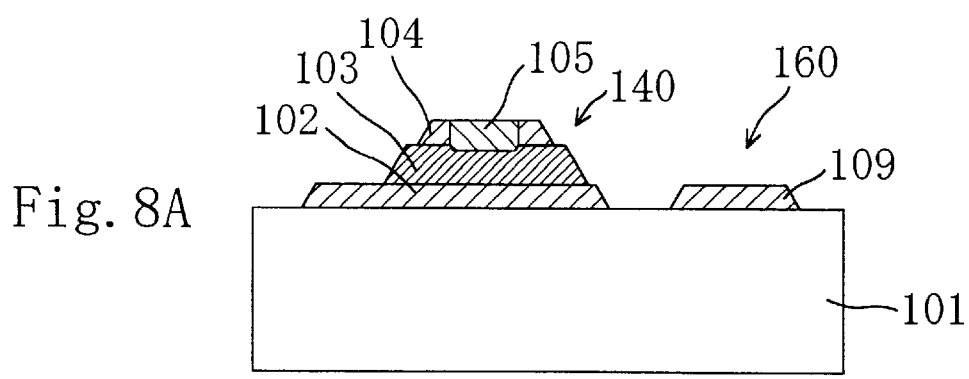
FIGS. 8A through 8D are cross-sectional views illustrating respective process steps for fabricating the photodetector of the third embodiment.

First, the same process steps as those illustrated in FIGS. 2A through 2D are carried out, thereby obtaining the structure shown in FIG. 8A, in which the photodiode and pad mesas 140 and 160 are formed on the semi-insulating InP substrate 101. The structure shown in FIG. 8A is formed by the fabrication process of the first embodiment. Thus, the effects of the first embodiment are also attainable by the third embodiment.

Figure 8B:
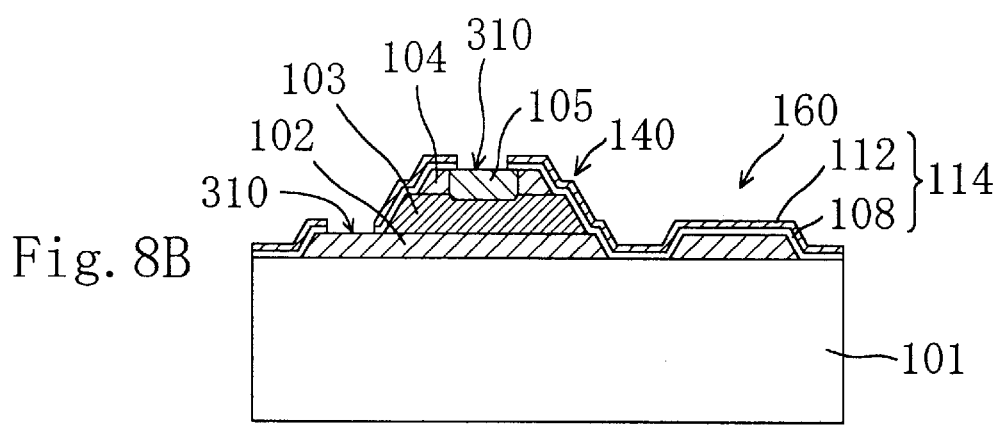

Next, as shown in FIG. 8B, a passivation film 108 of SiN and an interlevel dielectric film 112 of SiO$_2$ are deposited in this order over the substrate to thicknesses of about 30 nm and about 500 nm, respectively, so as to cover the photodiode and pad mesas 140 and 160. Then, parts of the interlevel dielectric and passivation films 112 and 108, in which the doped region 105 should be exposed and an n-side electrode 107 will be formed, respectively, are etched away, thereby forming openings 310. It should be noted that the parts of the insulating film 114 located over the photodiode mesa 140 cover the formerly exposed surfaces of the wide bandgap, light-absorbing and conductive layers 104, 103 and 102 and also have stepped side faces corresponding to those of the photodiode mesa 140.

Figure 8C:
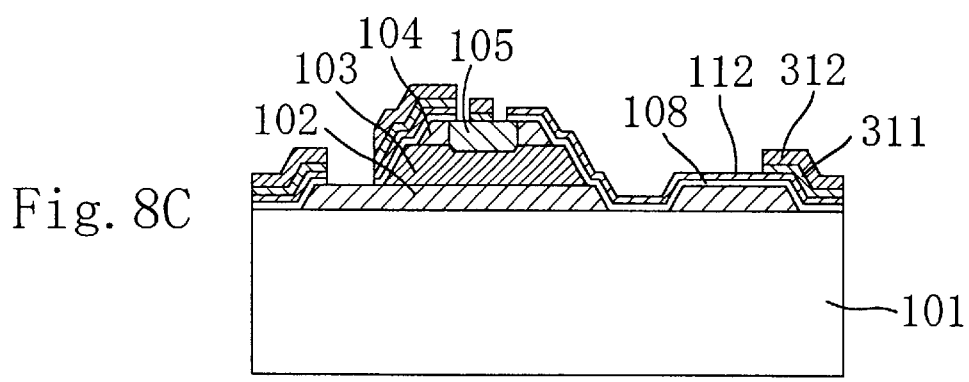

Subsequently, as shown in FIG. 8C, a spacer film 311 of SiN is deposited to a thickness of about 200 nm over the interlevel dielectric film 112 and then a negative photoresist pattern 312 for p- and n-side electrodes 106 and 107, pad 110 and interconnect 111 is defined thereon. And the spacer film 311 is partially etched away using the photoresist pattern 312 as a mask. The spacer film 311 is inserted between the undercoat insulating film 114 and the negative photoresist pattern 312. By inserting this spacer film 311, it is possible to prevent the patterned metal thin film from being lifted off unintentionally along with the metal thin film deposited on the photoresist pattern 303.

Figure 8D:
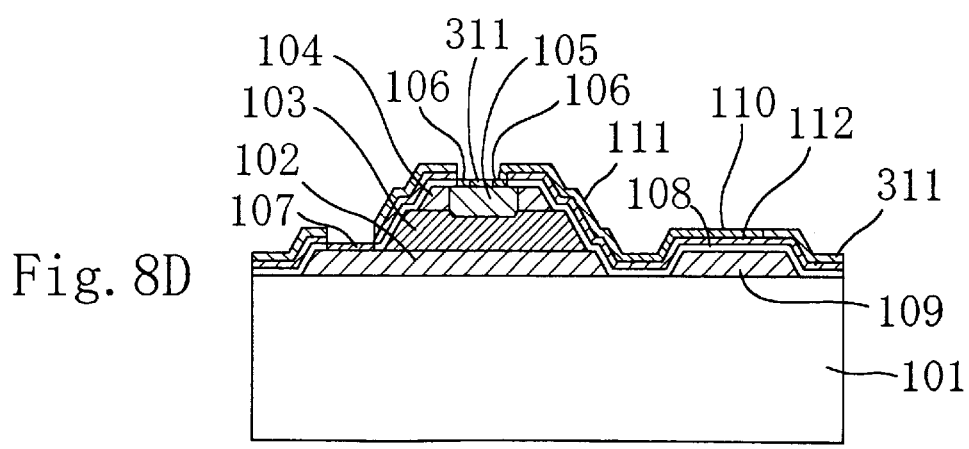

Then, as shown in FIG. 8D, Ti, Pt and Au films are deposited in this order over the substrate to respective thicknesses of about 50 nm, about 100 nm and about 400 nm and the photoresist pattern 312 is dissolved in acetone, for example, and lifted off. In this manner, the p- and n-side electrodes 106 and 107, pad 110 and interconnect 111 are formed at a time.

Thereafter, the spacer film 311 is removed, thereby completing the photodetector 300 shown in FIG. 7. Optionally, the spacer film 311 may be left as it is and used as an antireflection film for a photodetector of the type sensing light incoming through the principal surface thereof. As another alternative, an antireflection film may be newly deposited after the structure shown in FIG. 7 has been once obtained.

In the fabrication process of the third embodiment, the spacer film 311 is used. Accordingly, compared to using a photoresist pattern alone, the stack of the Ti, Pt and Au films can be lifted off more easily. Also, the spacer film 311 is made of SiN and the underlying interlevel dielectric film 112 is made of SiO$_2$, so the spacer film 311 can be etched selectively. More specifically, where a reactive ion etch process is carried out using a reactive gas like CF$_4$, the etch rate of SiN is much higher than that of SiO$_2$. Accordingly, if the spacer film 311 is removed by a reactive ion etch process, only the spacer film 311 is removable almost without etching the interlevel dielectric film 112.

In the photodetector 300 of the third embodiment, the pad electrode 110 is formed on the pad mesa 160, which is located in a different area from that of the photodiode mesa 140. Accordingly, no parasitic capacitance is associated with the pad electrode 110. In addition, the parasitic capacitance formed between the photodiode mesa 140 and interconnect 111 can also be reduced. As a result, the photodetector 300 can operate much faster than the known photodetector. Optionally, the third embodiment may be combined with the second embodiment. In that case, the effects of the second embodiment are also attainable.

What is claimed is:

1. A method for fabricating a photodetector, comprising the steps of:

a) stacking semiconductor conductive, light-absorbing and wide bandgap layers in this order on a semi-insulating semiconductor substrate by a crystal growth process, wherein the conductive layer has etch susceptibility different from that of the substrate, the light-absorbing layer absorbs incoming light, and the wide bandgap layer has a bandgap wider than a bandgap of the light-absorbing layer;

b) defining a doped region in part of the wide bandgap layer by doping said part with a dopant that reaches the light-absorbing layer;

c) etching and patterning the wide bandgap and light-absorbing layers into respectively predetermined shapes;

d) defining an etch mask on the conductive layer so that the wide bandgap and light-absorbing layers in the predetermined shapes are covered with the mask; and e) selectively removing part of the conductive layer using an etchant that etches said part of the conductive layer away with respect to the substrate.

2. The method of claim 1, wherein the step c) comprises the steps of:

i) defining a first etch mask on the wide bandgap layer so that the doped region is covered with the first mask after the step b) has been performed;

ii) selectively etching part of the wide bandgap layer away with respect to the light-absorbing layer;

iii) defining a second etch mask on the light-absorbing layer so that the wide bandgap layer is covered with the second mask; and iv) selectively etching part of the light-absorbing layer away with respect to the conductive layer.

3. The method of claim 2, wherein the substrate is made of InP, the conductive layer is made of InGaAsP, the light-absorbing layer is made of InGaAs, and the wide bandgap layer is made of InP, and wherein the etchant contains hydrochloric acid.

4. The method of claim 2, wherein the substrate is made of InP, the conductive layer is made of InGaAsP, the light-absorbing layer is made of InGaAs, and the wide bandgap layer is made of InP, and wherein the steps ii) and iv) are performed using an etchant containing sulfuric acid.

5. A method for fabricating a photodetector, comprising the steps of:

a) stacking semiconductor conductive, carrier barrier, light-absorbing and wide bandgap layers in this order on a semi-insulating semiconductor substrate by a crystal growth process, wherein the conductive layer has electrical conductivity, the barrier layer prevents carriers, created in the conductive layer, from diffusing and entering upper layers thereof, the light-absorbing layer absorbs incoming light, and the wide bandgap layer has a bandgap wider than a bandgap of the light-absorbing layer;

b) defining a doped region in part of the wide bandgap layer by doping said part with a dopant that reaches the light-absorbing layer;

c) defining a first etch mask on the wide bandgap layer so that the doped region is covered with the first mask;

d) selectively etching part of the wide bandgap layer away with respect to the light-absorbing layer using a first etchant;

e) defining a second etch mask on the light-absorbing layer so that the wide bandgap layer is covered with the second mask;

f) selectively etching part of the light-absorbing layer away with respect to the barrier layer using a second etchant;

g) selectively etching part of the barrier layer away with respect to the conductive layer using a third etchant;

h) defining a third etch mask on the conductive layer so that the wide bandgap, light-absorbing and carrier barrier layers are covered with the third mask; and i) selectively etching part of the conductive layer away with respect to the substrate using a fourth etchant.

6. The method of claim 5, wherein the substrate is made of InP, the conductive layer is made of InGaAsP, the barrier layer is made of InP, the light-absorbing layer is made of InGaAs, and the wide bandgap layer is made of InP, and wherein the first and third etchants contain hydrochloric acid, and wherein the second and fourth etchants contain sulfuric acid.

7. A method for fabricating a photodetector, comprising the steps of:

a) stacking semiconductor conductive, light-absorbing and wide bandgap layers in this order on a semi-insulating semiconductor substrate by a crystal growth process, wherein the conductive layer has etch susceptibility different from that of the substrate, the light-absorbing layer absorbs incoming light, and the wide bandgap layer has a bandgap wider than a bandgap of the light-absorbing layer;

b) defining a doped region in part of the wide bandgap layer by doping said part with a dopant that reaches the light-absorbing layer;

c) etching and patterning the wide bandgap and light-absorbing layers into respectively predetermined shapes;

d) selectively etching part of the conductive layer away, thereby defining a semiconductor multilayer structure, which includes the wide bandgap and light-absorbing layers in the predetermined shapes and the conductive layer, and leaving a second part of the conductive layer so that the second part serves as a second semiconductor conductive layer spaced apart from the conductive layer included in the multilayer structure;

e) depositing SiN and SiO$_2$ layers in this order over the surface of the multilayer structure, exposed parts of the substrate and the second conductive layer, thereby forming an insulating film including the SiN and SiO$_2$ layers;

f) removing part of the insulating film, which is located over the doped region in the wide bandgap layer included in the multilayer structure, thereby forming an opening over the doped region;

g) forming an electrode on part of the doped region inside the opening;

h) forming a pad for use to electrically connect the photodetector to an external unit on either part of the insulating film that has been formed on the exposed part of the substrate or another part of the insulating film that has been formed over the second conductive layer; and i) forming an interconnect on the insulating film to electrically connect the electrode and the pad together.

8. The method of claim 7, wherein the steps g), h) and i) are performed as a single process step.

9. The method of claim 8, wherein the single process step comprises:

depositing a spacer film of SiN on the insulating film;

defining a negative photoresist pattern on the spacer film to form the electrode, the pad and the interconnect;

etching parts of the spacer film away using the photoresist pattern as a mask;

depositing a metal on exposed parts of the insulating film and on the photoresist pattern, thereby forming a metal thin film thereon; and lifting the photoresist pattern off along with excessive parts of the metal on the photoresist pattern, thereby forming the electrode, the pad and the interconnect.

* * * * *